(12) United States Patent
Zou et al.

(10) Patent No.: US 10,670,973 B2
(45) Date of Patent: Jun. 2, 2020

(54) COLORING AWARE OPTIMIZATION

(71) Applicant: ASML Netherlands B.V., Veldhoven (NL)

(72) Inventors: Yi Zou, Foster City, CA (US); Jing Su, Sunnyvale, CA (US); Robert John Socha, Campbell, CA (US); Christopher Alan Spence, Los Altos, CA (US); Duan-Fu Stephen Hsu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 159 days.

(21) Appl. No.: 15/573,832

(22) PCT Filed: Apr. 29, 2016

(86) PCT No.: PCT/EP2016/059655
§ 371 (c)(1),
(2) Date: Nov. 13, 2017

(87) PCT Pub. No.: WO2016/184664
PCT Pub. Date: Nov. 24, 2016

(65) Prior Publication Data
US 2018/0259857 A1    Sep. 13, 2018

Related U.S. Application Data

(60) Provisional application No. 62/164,327, filed on May 20, 2015.

(51) Int. Cl.
*G06F 17/50*   (2006.01)
*G03F 7/20*    (2006.01)
(Continued)

(52) U.S. Cl.
CPC ...... *G03F 7/70433* (2013.01); *G03F 7/70466* (2013.01); *G06T 7/90* (2017.01); *G06T 11/001* (2013.01); *G06F 30/00* (2020.01)

(58) Field of Classification Search
USPC .................................. 716/51, 52, 53, 54, 55
See application file for complete search history.

(56) References Cited

U.S. PATENT DOCUMENTS

| | | |
|---|---|---|
| 5,229,872 A | 7/1993 | Mumola |
| 5,296,891 A | 3/1994 | Vogt et al. |

(Continued)

FOREIGN PATENT DOCUMENTS

| | | |
|---|---|---|
| CN | 104346490 | 2/2015 |
| JP | 2013-073139 | 4/2013 |
| WO | 2010/059954 | 5/2010 |

OTHER PUBLICATIONS

International Search Report and Written Opinion dated Sep. 22, 2016 in corresponding International Patent Application No. PCT/EP2016/059655.

(Continued)

*Primary Examiner* — Brian Ngo
(74) *Attorney, Agent, or Firm* — Pillsbury Winthrop Shaw Pittman LLP

(57) ABSTRACT

A method includes obtaining a sub-layout having an area that is a performance limiting spot, adjusting colors of patterns in the area, and determining whether the area is still a performance limiting spot. Another method includes decomposing patterns in a design layout into multiple sub-layouts; determining for at least one area in one of the sub-layouts, the likelihood of that a figure of merit is beyond its allowed range; and if the likelihood is above a threshold, that one sub-layout has a performance limiting spot. Another method includes: obtaining a design layout having a first group of patterns and a second group of patterns, wherein (Continued)

colors of the first group of patterns are not allowed to change and colors of the second group of patterns are allowed to change; and co-optimizing at least the first group of patterns, the second group of patterns and an illumination of a lithographic apparatus.

20 Claims, 19 Drawing Sheets

(51) Int. Cl.
    *G06T 7/90*         (2017.01)
    *G06T 11/00*      (2006.01)
    *G06F 30/00*      (2020.01)

(56) References Cited

U.S. PATENT DOCUMENTS

| | | | |
|---|---|---|---|
| 5,523,193 A | 6/1996 | Nelson | |
| 6,046,792 A | 4/2000 | Van Der Werf et al. | |
| 7,003,758 B2 | 2/2006 | Ye et al. | |
| 8,200,468 B2 | 6/2012 | Ye et al. | |
| 8,438,508 B2 | 5/2013 | Liu | |
| 8,473,874 B1 | 6/2013 | Sharma et al. | |
| 8,484,607 B1 | 7/2013 | Tang et al. | |
| 8,516,402 B1 | 8/2013 | Wang | |
| 8,739,082 B2 | 5/2014 | Liu et al. | |
| 8,786,824 B2 | 7/2014 | Hansen | |
| 9,262,579 B2 | 2/2016 | Chen et al. | |
| 2012/0254813 A1* | 10/2012 | Chen | G03F 7/70433 716/54 |
| 2014/0173533 A1* | 6/2014 | Sun | G06F 17/5081 716/52 |
| 2014/0245237 A1 | 8/2014 | Cilingir et al. | |
| 2014/0365983 A1 | 12/2014 | Chen et al. | |
| 2015/0100935 A1 | 4/2015 | Lin et al. | |
| 2015/0234974 A1 | 8/2015 | Dechene et al. | |

OTHER PUBLICATIONS

Spence, Chris, "Full-Chip Lithography Simulation and Design Analysis—How OPC Is Changing IC Design," Proc. SPIE, vol. 5751, pp. 1-14 (2005).

Cao, Yu et al., "Optimized Hardware and Software for Fast, Full Chip Simulation," Proc. of SPIE, vol. 5754, pp. 407-414 (2005).

Rosenbluth, Alan E. et al., "Optimum mask and source patterns to print a given shape," J. Microlith., Microfab., Microsys., vol. 1, No. 1, pp. 13-30 (2002).

Granik, Yuri, "Source optimization for image fidelity and throughput," J. Microlith., Microfab., Microsys., vol. 3, No. 4, pp. 509-522 (2004).

Socha, Robert et al., "Simultaneous Source Mask Optimization (SMO)," Proc. of SPIE, vol. 5853, pp. 180-193 (2005).

\* cited by examiner

US 10,670,973 B2

COLORING AWARE OPTIMIZATION

CROSS-REFERENCE TO RELATED APPLICATIONS

This application is the U.S. national phase entry of PCT patent application no. PCT/EP2016/059655, which was filed on Apr. 29, 2016, which claims the benefit of priority of U.S. application No. 62/164,327, which was filed on May 20, 2015, and which is incorporated herein in its entirety by reference.

TECHNICAL FIELD

The description herein relates to lithographic projection apparatuses and processes, and more particularly to a method or tool for adjusting the lithographic projection apparatuses and processes.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a computer-implemented method comprising: obtaining a sub-layout comprising an area that is a performance limiting spot; adjusting colors of patterns in the area; and determining whether the area is still performance limiting spot.

According to an embodiment, the method further comprises subjecting the patterns to optical proximity correction (OPC).

According to an embodiment, the method further comprises: if the area is still performance limiting spot, readjusting the colors of the patterns.

According to an embodiment, adjusting the colors comprises: searching for color combinations of the patterns, wherein the color combinations make the performance limiting spot no longer a performance limiting spot; if no color combination is found, the patterns are combined with at least some patterns outside the performance limiting spot of the sub-layout.

According to an embodiment, searching for color combinations of the patterns comprises: obtaining a set of color combinations of the patterns, wherein the color combinations do not violate any design rules for the sub-layer; for each of color combinations in the set, determining one or more characteristics of a lithography process using that color combination; selecting one color combination from the set based on the characteristics.

According to an embodiment, identifying a pair of patterns among the patterns in the performance limiting spot; assigning different colors to the pair of patterns.

According to an embodiment, the one or more characteristics comprise one or more characteristics of an image produced using the that color combination.

Disclosed herein is a computer-implemented method comprising: decomposing patterns in a design layout into multiple sub-layouts; determining for at least one area in one of the sub-layouts, the likelihood of that a figure of merit is beyond its allowed range; if the likelihood is above a threshold, that one sub-layout has a performance limiting spot.

According to an embodiment, the method further comprises subjecting patterns on each of the sub-layouts to optical proximity correction (OPC).

Disclosed herein is a computer-implemented method comprising: obtaining a design layout comprising a first group of patterns and an optional second group of patterns, wherein colors of the first group of patterns are not allowed to change and colors of the second group of patterns are allowed to change; identifying all color combinations of the first group of patterns and the optional second group of patterns, wherein the color combinations do not violate any design rules; optionally selecting representatives of the first group of patterns and color combinations thereof, and the optional second group of patterns; co-optimizing the design layout and a source of a lithographic apparatus for the representatives or the design layout for the first group of patterns and the optional second group of patterns; if not all of the first group of patterns and the optional second group of patterns with all the color combinations satisfy one or more criteria, adjusting selection of the representatives to include more patterns thereto, or adjusting co-optimization.

According to an embodiment, co-optimizing at least the first group of patterns, the second group of patterns and the source comprises: computing a multi-variable cost function of a plurality of design variables comprise characteristics of at least the first group of patterns, the second group of patterns and the source; and iteratively reconfiguring at least the first group of patterns, the second group of patterns and the source by adjusting the design variables until a predefined termination condition is satisfied.

According to an embodiment, the design variables comprise characteristics of projection optics of the lithographic apparatus.

According to an embodiment, the predefined termination condition is one minimization of the cost function or maximization of the cost function.

According to an embodiment, iterative reconfiguration is performed with constraints on at least some of the design variables.

Disclosed herein is a computer-implemented method comprising: obtaining a pattern to be matched from a database; obtaining a color for the pattern to be matched based on a metric of simulation of the pattern to be matched; identifying patterns identical or similar to the pattern to be matched from a design layout; assigning the color to the identified patterns; combining a second pattern with the identified patterns into a combination; adjusting or assigning colors to patterns in the combination to resolve any conflict among the combination.

According to an embodiment, the method further comprises subjecting the combination to OPC.

According to an embodiment, the method further comprises subjecting the combination to manufacturability check.

According to an embodiment, the color assigned to the first pattern does not change in adjusting or assigning the colors to the patterns in the combination.

Disclosed herein is a computer-implemented method comprising: obtaining a pattern to be matched from a database; obtaining a color for the pattern to be matched from the database; identifying patterns identical or similar to the pattern to be matched from a design layout; assigning the color to the identified patterns; combining a second pattern with the identified patterns into a combination; adjusting or assigning colors to patterns in the combination to resolve any conflict among the combination.

According to an embodiment, the method further comprises subjecting the combination to OPC.

According to an embodiment, the method further comprises subjecting the combination to manufacturability check.

Disclosed herein is a computer-implemented method comprising: identifying a group of color combinations of a group of patterns; determining a characteristic of a lithography process under a condition using each of the group of combinations is determined; selecting a sub-group of color combinations from the group of color combinations based on the characteristic of the lithography process.

According to an embodiment, the group of color combinations comprises all possible color combinations of the group of patterns.

According to an embodiment, the condition comprises one or more parameters of a lithography apparatus used the lithography process.

According to an embodiment, the condition comprises one or more parameters of the lithography process.

Disclosed herein is a computer-implemented method comprising: searching for a match to a pattern in a design layout or sub-layout among patterns stored in a database; if a match is found, adjusting a characteristic of the pattern so that the adjusted pattern does not have a match in the database.

According to an embodiment, the characteristic is shape or location of the pattern.

Disclosed herein is a computer program product comprising a computer readable medium having instructions recorded thereon, the instructions when executed by a computer implementing the method of any of the above claims.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
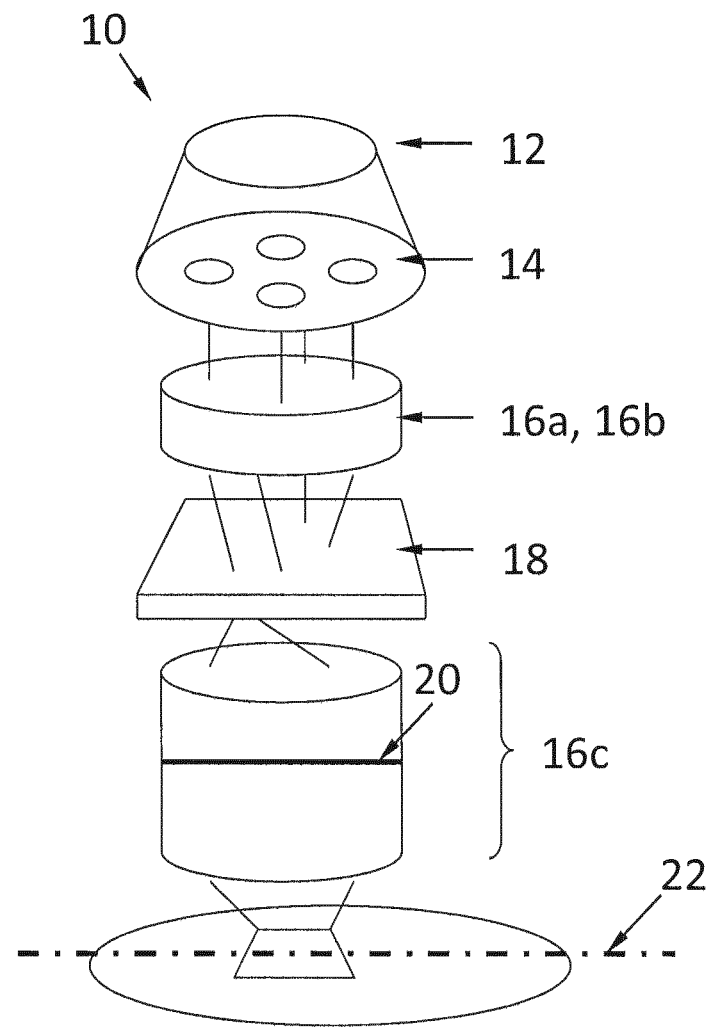
FIG. 1 is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law." At the current state of technology, layers of devices are manufactured using lithographic projection apparatuses that project a design layout onto a substrate using UV radiation from a deep-ultraviolet (DUV) illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance.

The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

To overcome the difficulty to reproduce a pattern on the substrate that resembles the intended shape and dimensions, sophisticated fine-tuning steps are applied to the lithographic projection apparatus and/or design layout. These fine-tuning steps include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly.

As an example of the fine-tuning steps, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and mask (patterning device) optimization method and system that allows for simultaneous optimization of the source and mask using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

The patterning device referred to above comprise design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In a lithographic projection apparatus, a source provides illumination (i.e. radiation); projection optics direct and shapes the illumination via a patterning device and onto a substrate. The term "projection optics" may include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

From a design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

As the dimensions of functional elements made in a semiconductor manufacturing process (e.g., lithography processes) continue to shrink, accurately printing the intended design layout becomes more challenging. One approach to overcome this challenge is called "multiple exposure." Multiple exposure is a sequence of several separate exposures of a single functional layer in a semiconductor device using several different patterning devices, each carrying a portion of the patterns to be printed to the single functional layer, or using the same programmable patterning device (e.g., programmable minor array or programmable LCD array) carrying different portions of the patterns at different times. Although multiple exposure may be useful in overcoming the difficulty of printing many patterns in one exposure, it also introduces more design variables—the colors of the patterns. The colors are discrete in their nature because the colors label different sub-layouts. One technique to determine which of the patterns will be carried on which patterning device ("decomposition" of the patterns) may be by the orientation of the patterns, which is referred to as "double dipole lithography" (DDL). For example, one patterning device may carry lines oriented in one direction and another patterning device may carry lines oriented in a perpendicular direction. This allows the decomposition of two-dimensional patterns into two one-dimensional patterns, which are easier to print. Another technique to determine which of the patterns will be carried on which patterning device is called "double patterning technology" (DPT) or "multiple patterning technology" (MPT). MPT is a set of technologies to enhance the feature density. The simplest case of multiple patterning is double patterning technology (DPT), where a conventional lithography process is enhanced to produce double the expected number of features by allowing a design layout to be carried on two masks.

Figure 2:
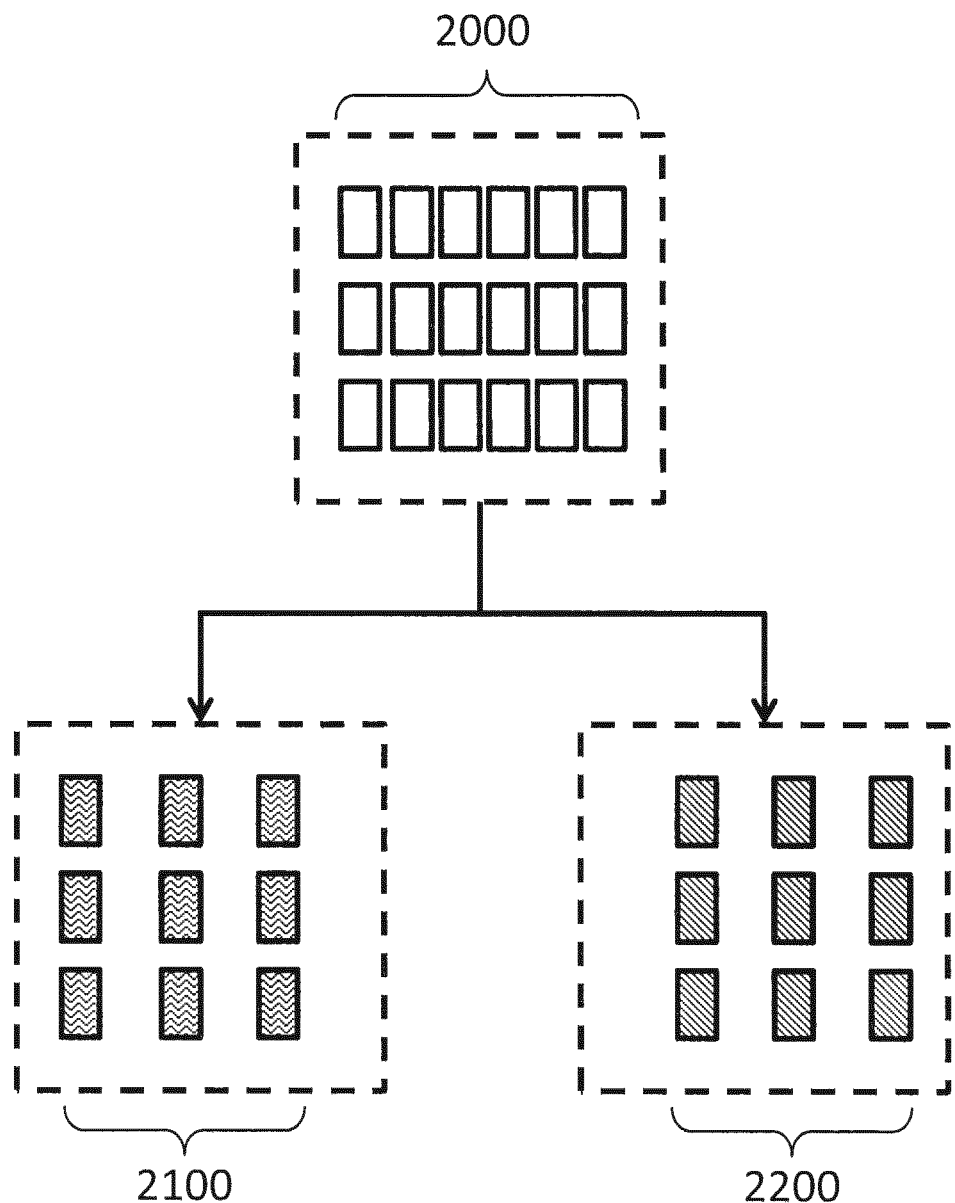
FIG. 2 schematically shows decomposition of patterns to be printed on one layer.

FIG. 2 schematically shows decomposition of the patterns 2000 to be printed on one layer. These patterns 2000 may be closely positioned to one another, which may make printing them in one exposure difficult (e.g., more sophisticated optimization needed or more computational resources needed to correct proximity effect). If the patterns 2000 are "decomposed" into multiple groups (e.g., groups 2100 and 2200) (also known as "sub-layouts") and each group is exposed onto the substrate at different time, the difficulty may well be overcome because the patterns within each group are not so close to one another. In another word, the term "sub-layout" may be defined as a group of patterns of a design layout where the group of patterns are carried on a different physical mask or on the same programmable patterning device at a different time from the other patterns of the design layout. After the patterns of each of the sub-layouts are printed to the substrate, the entire design layout is printed to the substrate. Namely, the sub-layouts of a design layout can be used in different exposures creating a single functional layer in the device. It is customary to assign a "color" to each of the groups for identification purposes. The word "color" in this context is merely an assignment of some patterns of a design layout to one sub-layout that may be suitable for multiple exposure to produce a single functional layer in a device. The word "color" in this context does not refer to the wavelength of the electromagnetic radiation the groups might emit or scatter, nor the visual appearance of the groups. For example, if group 2100 is "red" and group 2200 is "blue," group 2100 will be carried on a patterning device (may be called the "red" patterning device) and group 2200 will be carried on another patterning device (may be called the "blue" patterning device). A pattern within group 2100 may be referred to as a "red" pattern and a pattern within group 2200 may be referred to as a "blue" pattern. Therefore, decomposition of the patterns to be printed on one layer onto multiple patterning devices may be called "coloring."

Figure 3A:
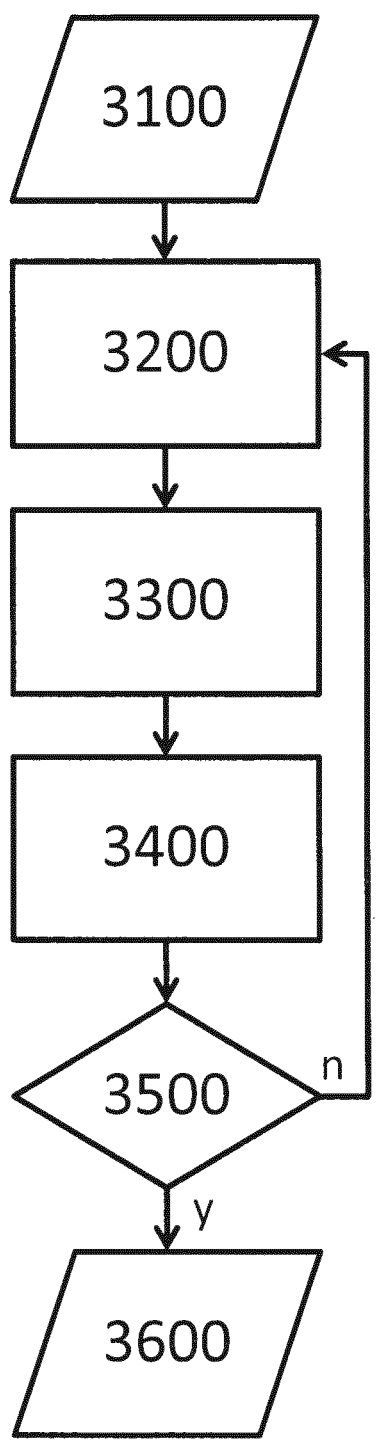
FIG. 3A shows a flow chart for a method for locally adjusting the color of the patterns in a performance limiting spot of a sub-layout.

FIG. 3A shows a flow chart for a method for locally adjusting the color of the patterns (i.e., reassigning some of the patterns to a different sub-layout) in a performance limiting spot of a sub-layout 3100. The term "performance limiting spot" means an area in a design layout or sub-layout where the likelihood that a figure of merit is beyond its allowed range is above a threshold. Examples of the figure of merit may include depth of focus (DOF), exposure latitude (EL), mask error enhancement factor (MEEF) or process variability (PV) band, overlay, edge placement error (EPE), critical dimension (CD), etc. A performance limiting spot may be identified using a few suitable methods. For example, a performance limiting spot can be identified empirically—if the patterns in an area of the layout or sub-layout violate a manufacturability rule, that area may be identified as a performance limiting spot. For example, a performance limiting spot may be identified by simulation—if the simulated image of the patterns in an area of the layout or sub-layout shows a figure of merit beyond its allowed range therein or if the area is predicted to have a high probability of having a figure of merit beyond its allowed range, the area may be identified as a performance limiting spot. In 3200, the colors of some of the patterns in the performance limiting spot are adjusted. Namely, the colors of some of the patterns in the performance limiting spot may change. As explained above, changing the colors of the patterns is the same as reassigning the patterns to a different sub-layout. For example, a performance limiting spot may have more patterns after the color adjustment when patterns on another sub-layout are recolored and reassigned into this sub-layout and into the performance limiting spot; a performance limiting spot may have fewer patterns when some patterns in the performance limiting spot are recolored and reassigned to another sub-layout. As previously explained, a sub-layout is a group of patterns printed onto the substrate in one exposure. Different sub-layouts may be carried on different physical masks or on the same patterning device at different times. Because the color adjustment in 3200 may change the composition of the performance limiting spot, the color adjustment in 3200 may change the proximity effects among the patterns in the performance limiting spot. Therefore, in 3300, the patterns in the performance limiting spot undergo OPC. In 3400, it is determined whether the performance limiting spot is still a performance limiting spot (i.e., likelihood of a figure of merit being beyond its allowed range above a threshold) after the color adjustment in 3200 and OPC in 3300. In 3500, if the performance limiting spot is still a performance limiting spot (i.e., likelihood of a figure of merit being beyond its allowed range above a threshold), the flow goes back to 3200 to further adjust the color; if the performance limiting spot is not a performance limiting spot any more (i.e., likelihood of a figure of merit being beyond its allowed range no longer above a threshold) after the color adjustment in 3200, an improved (because of one less performance limiting spot) sub-layout 3600 is obtained. The flow may be repeated on each performance limiting spot if the sub-layout has more than one performance limiting spot.

Figure 3B:
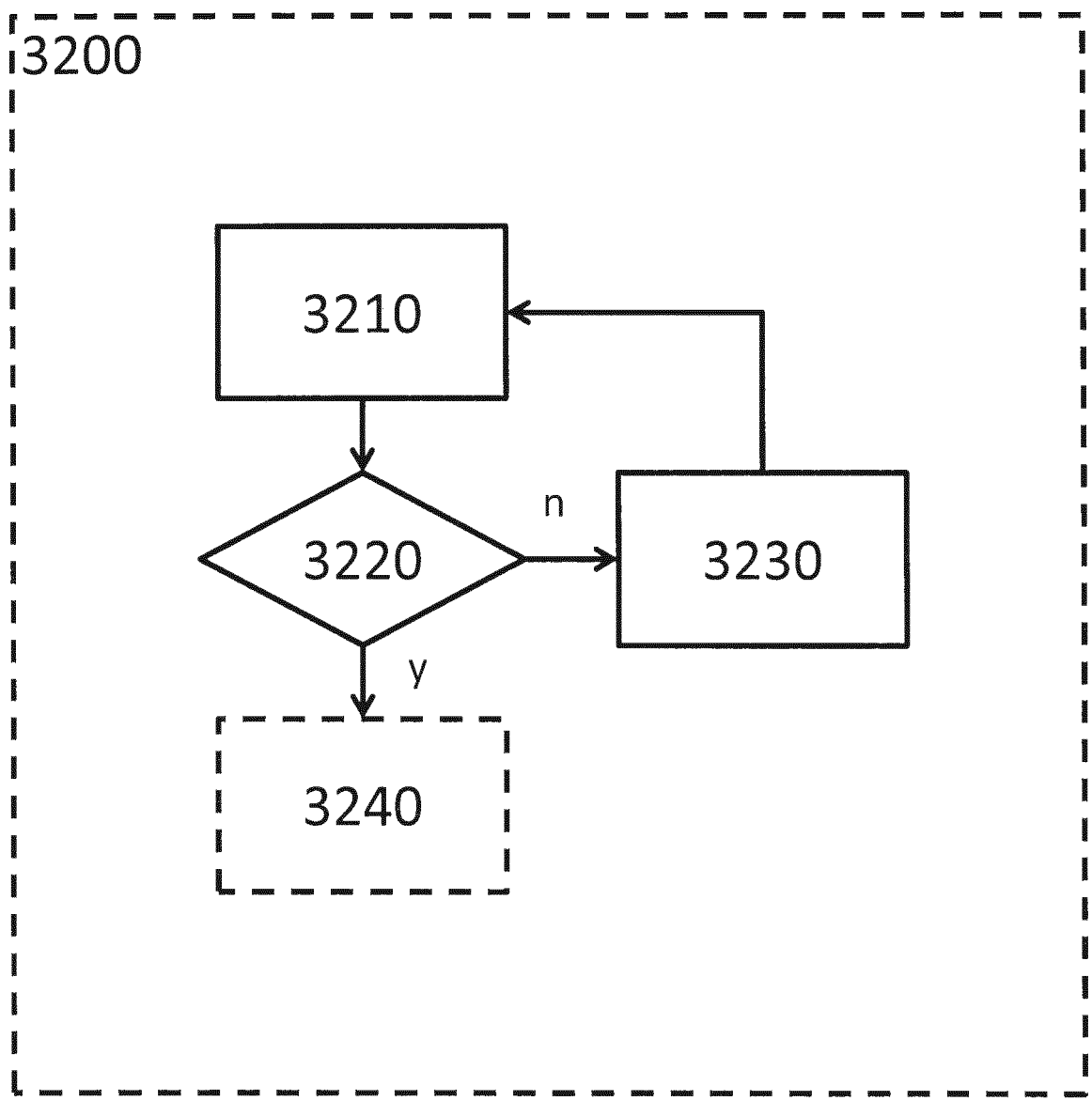
FIG. 3B schematically shows a flow chart for a method for adjusting colors of the patterns in a performance limiting spot, suitable for a step in FIG. 3A.

FIG. 3B schematically shows a flow chart for a method for adjusting colors of the patterns in a performance limiting spot, suitable for 3200 in FIG. 3A. In 3210, search for color combinations of the patterns in the performance limiting spot where the color combinations make the performance limiting spot no longer a performance limiting spot (i.e., likelihood of a figure of merit being beyond its allowed range no longer above a threshold) if one of these color combinations is applied to the patterns. In 3220, determine whether such a color combination if found. If at least one such color combination is found in 3220, the flow goes to optional 3240, in which characteristics of the lithography process using the at least one color combination may be determined (e.g., by simulation). For example, the characteristics may include characteristics (e.g., image log slope (ILS)) of images produced in the lithography process using the at least one color combination. The characteristics may be based upon to select among those color combinations found in 3210. If no such color combination is found in 3220, the flow goes to 3230 where patterns around the performance limiting spot and the patterns in the performance limiting spot are combined to enlarge the number of color combinations and the combined patterns undergo 3210 again. Conflicts between the patterns in the performance limiting spot and the patterns around the performance limiting spot may be a reason that no such color combination is found. In this situation, combining the patterns in the performance limiting spot and the patterns around the performance limiting spot will allow color adjustment to both, which makes it possible to resolve these conflicts at the boundary of the performance limiting spot. A conflict means a pair of patterns negatively impacting each other if the pair of patterns are on the same physical mask or represented on the same programmable patterning device at the same time. Namely, a conflict is a requirement that the pair of patterns must be on different sub-layouts. A conflict may be determined empirically, based on, for example, the geometry of the patterns. For example, a conflict exists if the patterns violate a manufacturability or design rule. A conflict may also be determined by simulation.

Figure 3C:
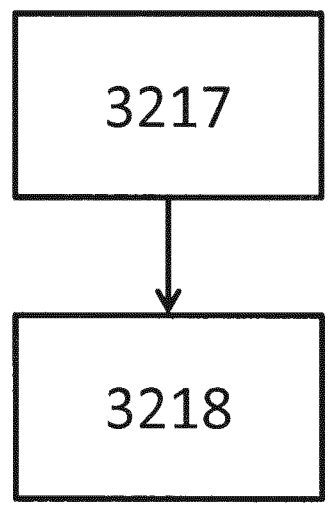
FIG. 3C schematically shows a flow chart for a method for searching for color combinations of the patterns in the performance limiting spot where the color combination makes the performance limiting spot no longer a performance limiting spot, suitable for a step in FIG. 3B.

FIG. 3C schematically shows a flow chart for a method for searching for color combinations of the patterns in the performance limiting spot where the color combination makes the performance limiting spot no longer a performance limiting spot, suitable for 3210 in FIG. 3B. In 3217, identify conflicts among the patterns in the performance limiting spot. For example, the conflicts may be possible defects as determined by a simulation. In 3218, adjust colors of the patterns (e.g., the patterns connected with at least one conflict) until all the conflicts are resolved.

Figure 3D:
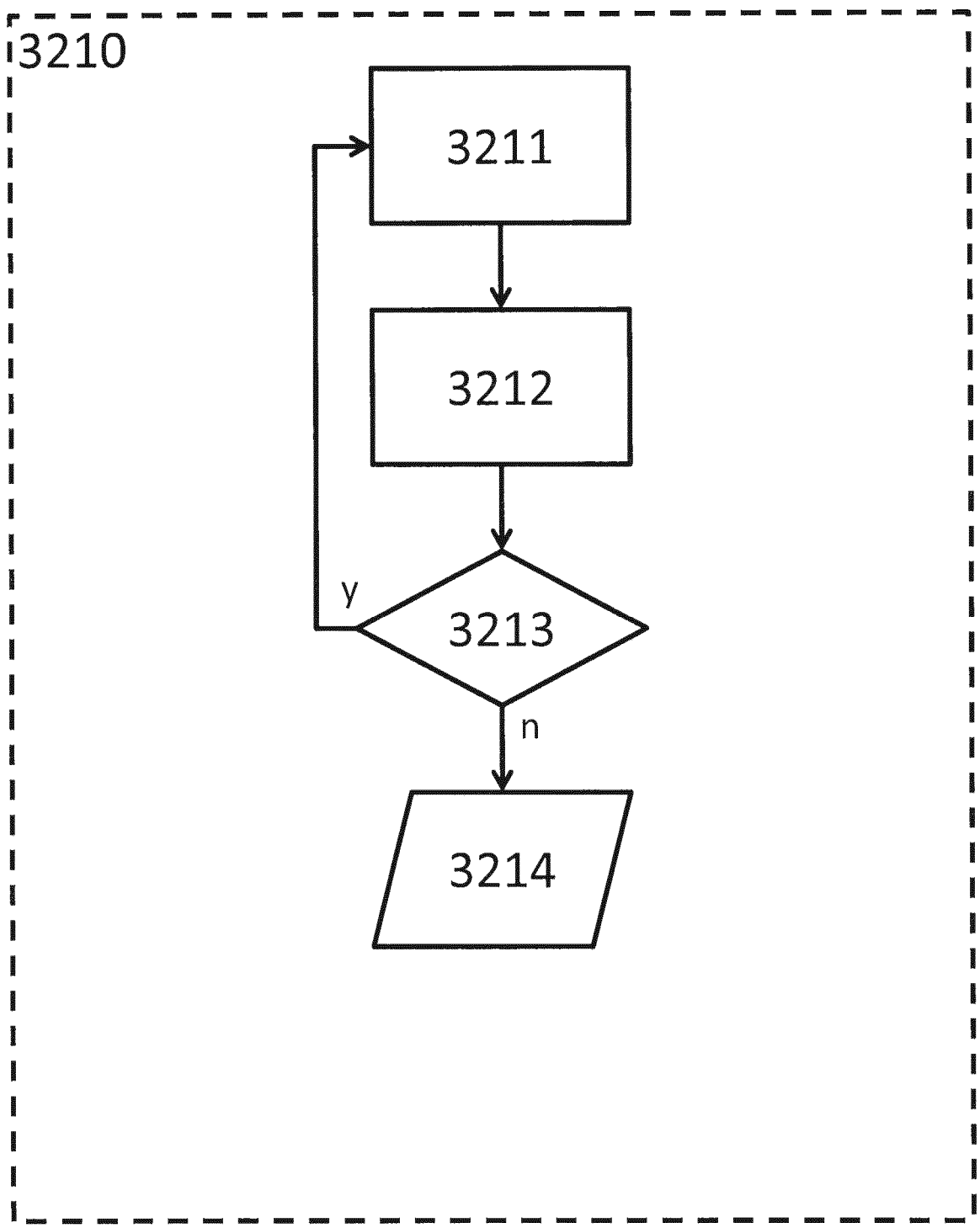
FIG. 3D schematically shows a flow chart for a method for searching for color combinations of the patterns in the performance limiting spot where the color combination makes the performance limiting spot no longer a performance limiting spot, suitable for a step in FIG. 3B.

FIG. 3D schematically shows a flow chart for a method for searching for color combinations of the patterns in the performance limiting spot where the color combination makes the performance limiting spot no longer a performance limiting spot, suitable for 3210 in FIG. 3B. The method is FIG. 3D enumerates the color combinations of the patterns in the performance limiting spot using a suitable search algorithm (e.g., depth-first search (DFS) algorithm, backtracking algorithm, integer linear programming (ILP)). In 3211, identify one of the color combinations of the patterns in the performance limiting spot. In 3212, determine whether the identified color combination violates any design rules for the sub-layer the performance limiting spot is on. In 3213, if the identified color combination does not violate any design rules, include it in a set 3214; if the identified color combination does violate any design rules, the flow goes back to 3211 to identify another one of the color combinations. Characteristics of the lithography processes using each of the color combinations in the set 3214 may be determined (e.g., by simulation). For example, the characteristics may include characteristics (e.g., image log slope (ILS)) of images produced in the lithography processes using the at least one color combination.

Figure 3E:
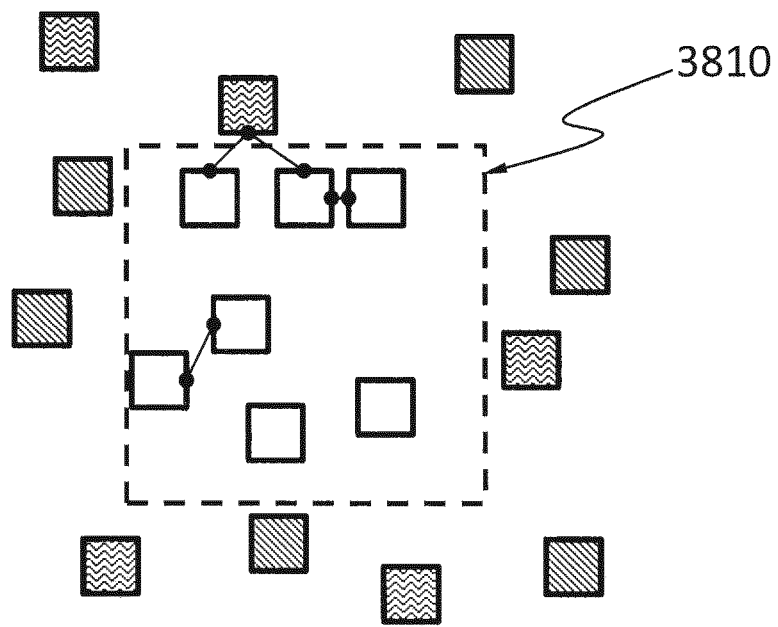
FIG. 3E and FIG. 3F schematically show the flow in FIG. 3B applied to a performance limiting spot.
Figure 3F:
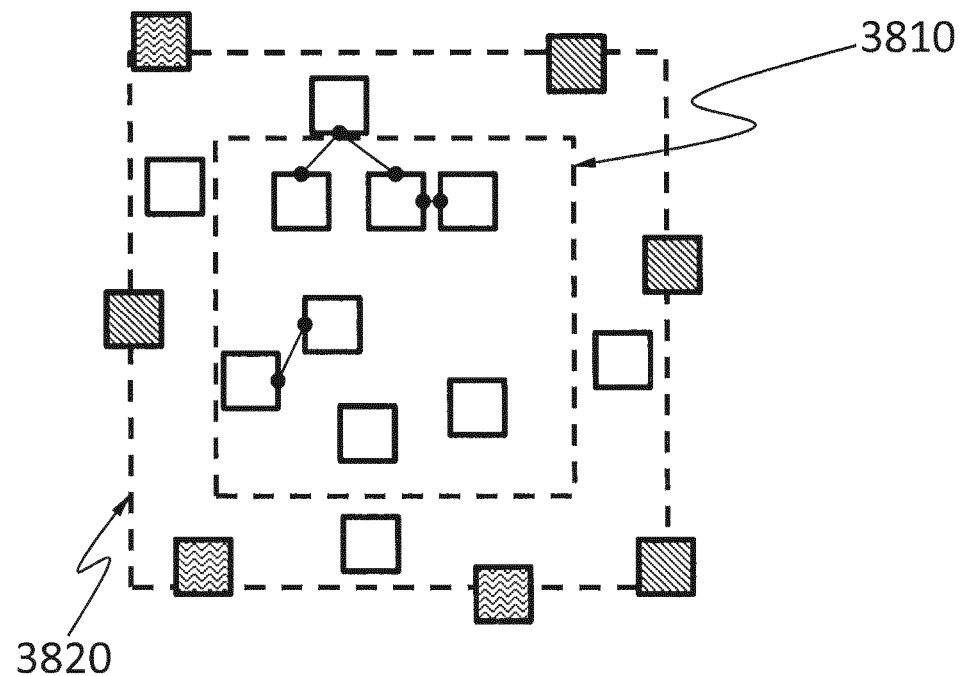

FIG. 3E and FIG. 3F schematically show the flow in FIG. 3B applied to a performance limiting spot 3810. Only the patterns (without hatches) in the performance limiting spot 3810 are allowed to change colors, while patterns (with hatches) outside the performance limiting spot 3810 are not allowed to change colors. A pattern in the performance limiting spot 3810 and a pattern outside the performance limiting spot 3810 may have a conflict (e.g., manufacturability or design rule violation) and two patterns in the performance limiting spot may have a conflict. Conflicts are represented by lines connected a pair of patterns in FIG. 3E and FIG. 3F. If adjusting the colors of only the patterns in the performance limiting spot 3810 cannot resolve all the conflicts, additional patterns may be allowed to change color. As shown in FIG. 3F, four additional patterns (without hatches) within an area 3820 larger than the performance limiting spot 3810, which were not allowed to change color, are now allowed to change color. By having more patterns allowed to change color, it is more possible to find a color combination that resolves all the conflicts.

Figure 4:
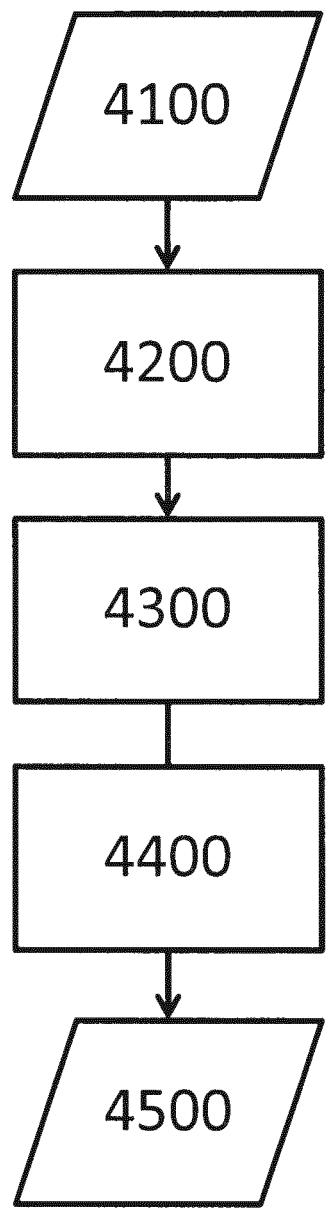
FIG. 4 shows a flow chart for a method for identifying one or more performance limiting spots in a sub-layout.

FIG. 4 shows a flow chart for a method for identifying one or more performance limiting spots in a sub-layout 4100. In 4200, the patterns in the design layout 4100 are decomposed into multiple sub-layouts (i.e., each of the patterns is assigned a color). In 4300, patterns on each of the sub-layouts are subjected to OPC. In 4400, determine for at least one area in the sub-layout, whether the likelihood that a figure of merit in the area is beyond its allowed range is above a threshold. If the likelihood that a figure of merit in the area is beyond its allowed range is above a threshold, the sub-layout is one of those sub-layouts 4500 having at least one performance limiting spot.

Figure 5:
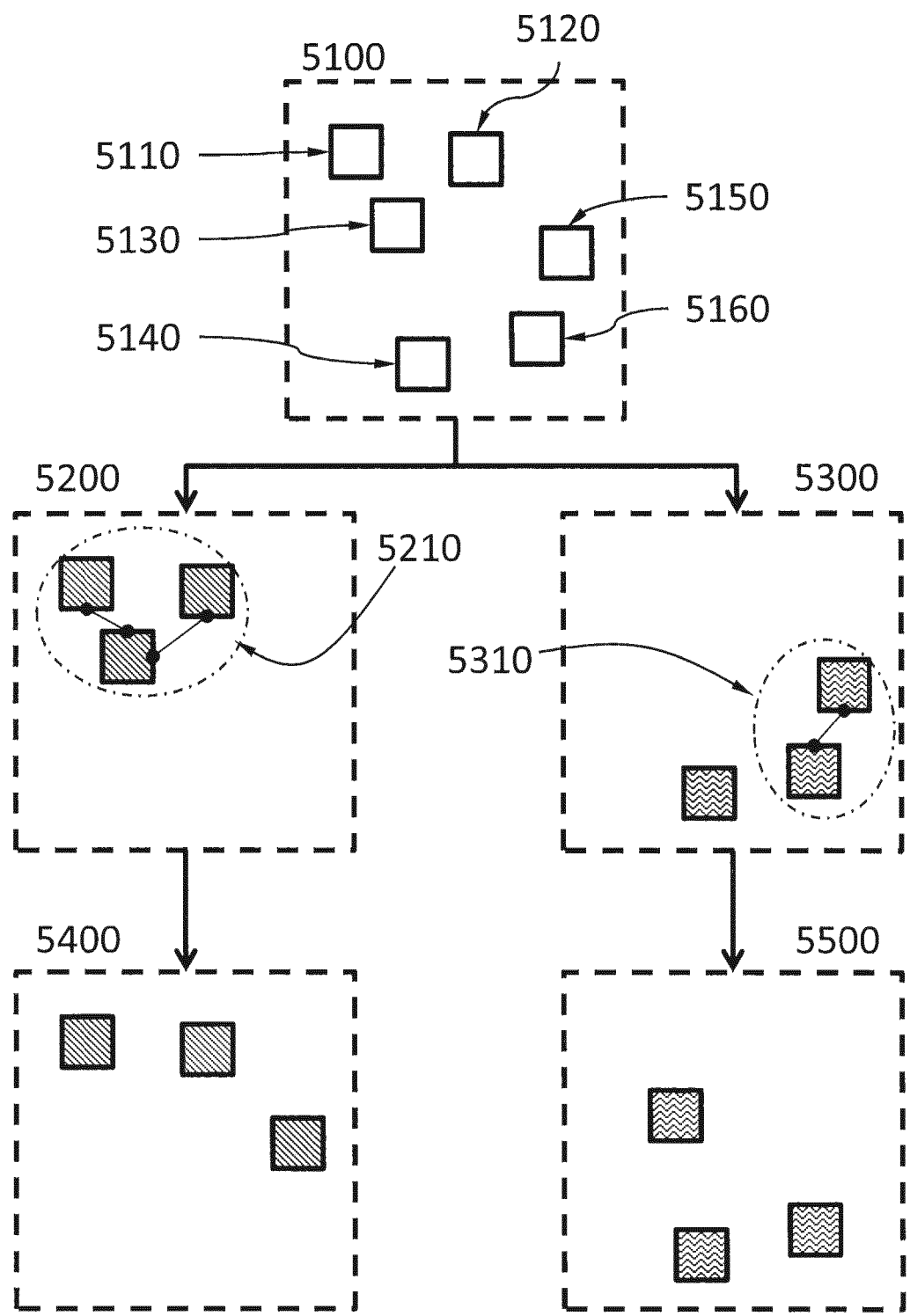
FIG. 5 schematically shows a design layout having six patterns, whose colors are adjusted.

FIG. 5 schematically shows a design layout 5100 having six patterns 5110, 5120, 5130, 5140, 5150 and 5160, whose colors are adjusted. The six patterns 5110, 5120, 5130, 5140, 5150 and 5160 are decomposed into two sub-layouts 5200 and 5300, for example, using the flow shown in FIG. 4. Sub-layout 5200 includes patterns 5110, 5120 and 5130. Sub-layout 5300 includes patterns 5140, 5150 and 5160. Sub-layout 5200 has a performance limiting spot 5210 because pattern 5130 is too close to pattern 5110 and pattern 5130 is too close to pattern 5120. Performance limiting spot 5210 includes patterns 5110, 5120 and 5130. Sub-layout 5300 has a performance limiting spot 5310 because patterns 5150 and 5160 are too close to each other. Performance limiting spot 5310 includes patterns 5150 and 5160, but not pattern 5140. The colors of the patterns in performance limiting spots 5210 and 5310 may be adjusted to obtain improved sub-layouts 5400 and 5500. In this example, improved sub-layout 5500 is obtained from sub-layout 5300 by adding pattern 5130 and removing pattern 5150;

improved sub-layout 5400 is obtained from sub-layout 5200 by adding pattern 5150 and removing pattern 5130.

Figure 6A:
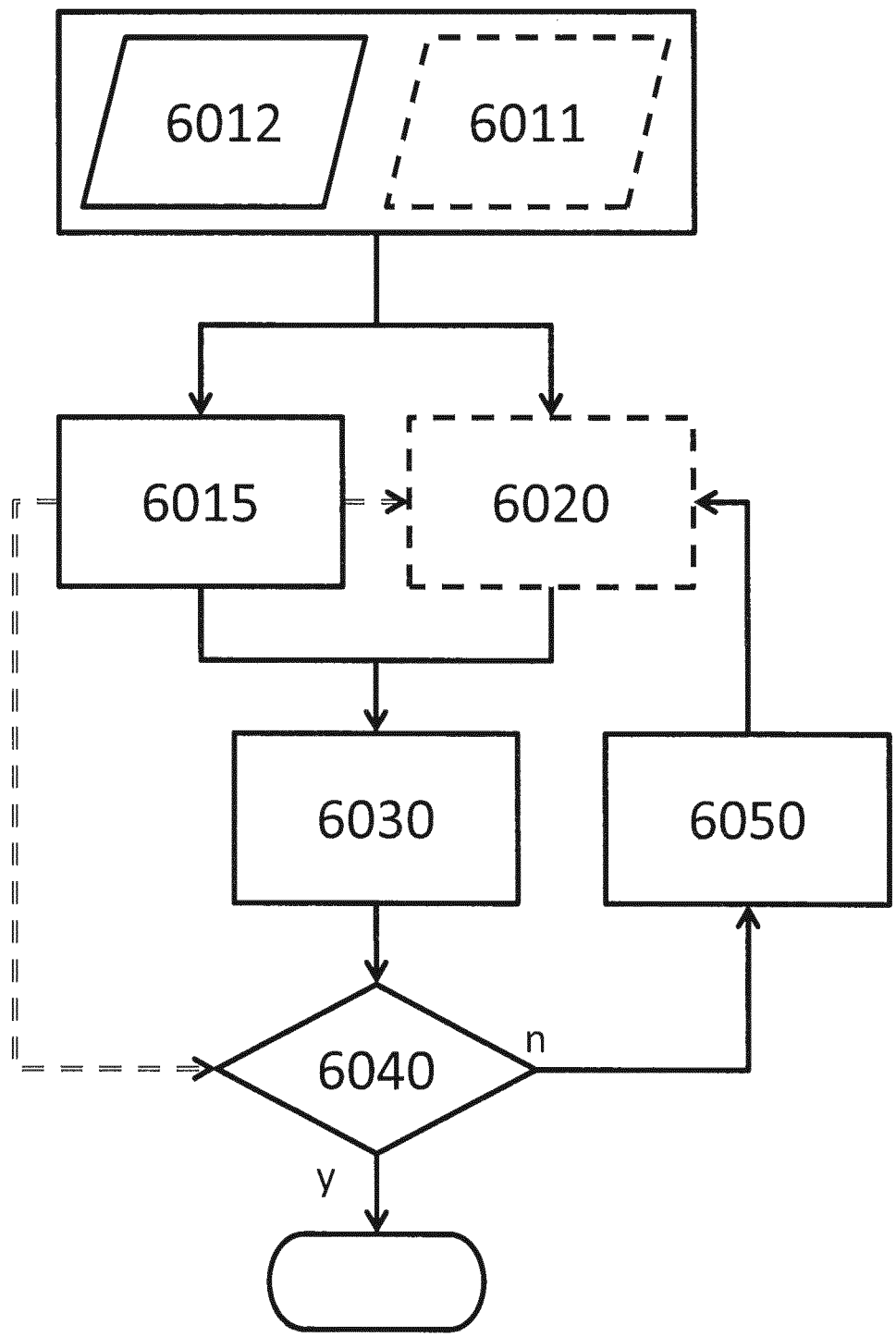
FIG. 6A schematically shows a flow chart for a method for co-optimizing at least the design layout and the source.

FIG. 6A schematically shows a flow chart for a method for co-optimizing at least the design layout and the source (other design variables such as the projection optics may be also co-optimized), where the colors of at least some of the patterns in the design layout are adjustable. The number of possible color combinations of N patterns is $C^N$, where c is the number of possible colors. Selecting one among this many color combinations is not trivial. In a design layout, colors of some patterns 6011 may be disallowed to change, and colors of the other patterns 6012 may be allowed to change. In 6015, all the color combinations of the patterns 6012 that do not violate any design rules are identified. The patterns 6011 and 6012 may repeat at different locations on the substrate but they may have different color combinations at these locations. The identified color combinations at least do not include any color combinations inconsistent with the colors of the patterns 6011. The color combinations may be presented to a user. The color combinations presented to the user may include the best or the worst color combination for both the first and second groups of patterns. The user may choose the best color combination for a design for tape-out purpose. Alternatively, the user can choose the worse color combination to refine the design rules, to feed it back to a design tool (e.g. placer & router) to prevent the worst color combination to appear in the design layout, or to store the worst color combination in a library to forbid using of the color combination in other designs, more details of which will be described below in connection with FIG. 6B. Patterns 6011 and patterns 6012, no matter where they are on the substrate, are still printed using the same source. Therefore, the source should be suitable for patterns 6012 including all the color combinations thereof identified in 6015, and patterns 6011. Representative clips of patterns 6011 and/or representative clips of patterns 6012 may be used in this method instead of all the patterns in the design layout. In optional 6020, a group of representatives ("selected patterns") of patterns 6011, the color combinations of patterns 6011 identified in 6015, and patterns 6012, are selected, for example, to reduce the computational resources needed for the next several steps. Examples of methods for selecting the representatives can be found in commonly assigned U.S. Pat. Nos. 8,438,508 and 8,739,082, are hereby incorporated by reference their its entirety. In 6030, the design layout, the source and other suitable design variables such as the projection optics are co-optimized to improve the printability of the representatives or all of the patterns 6012 and the patterns 6011. The co-optimization may additionally optimize the performance of the lithography process, such as the process window and yield. In 6040, if all of the patterns 6012 and the color combinations thereof, and the patterns 6011 satisfy one or more criteria (e.g., passing a manufacturability check (MC), a dimension of the process window being above a threshold, throughput, etc.), the source, the design layout, and any other design variables optimized in 6030 may be suitable for use in the lithography process, or may be presented to a user. MC may be based on a set of rules or on simulation (e.g., simulation of images or a metric of the lithography process). MC determines whether a particular set of patterns are likely to be produced without a defect under a given condition. In 6040, if not all of the first group of patterns and the optional second group of patterns, with all color combinations of the first group satisfy one or more criteria (e.g., passing a manufacturability check (MC), a dimension of the process window being above a threshold, throughput, etc.), the flow moves to 6050, in which selecting the representatives in 6020 is adjusted to include more patterns (e.g., those patterns that fail MC in 6040) into the representatives and/or the co-optimization in 6030 is adjusted to change the weights of various penalties to the cost function used in the co-optimization.

Figure 6B:
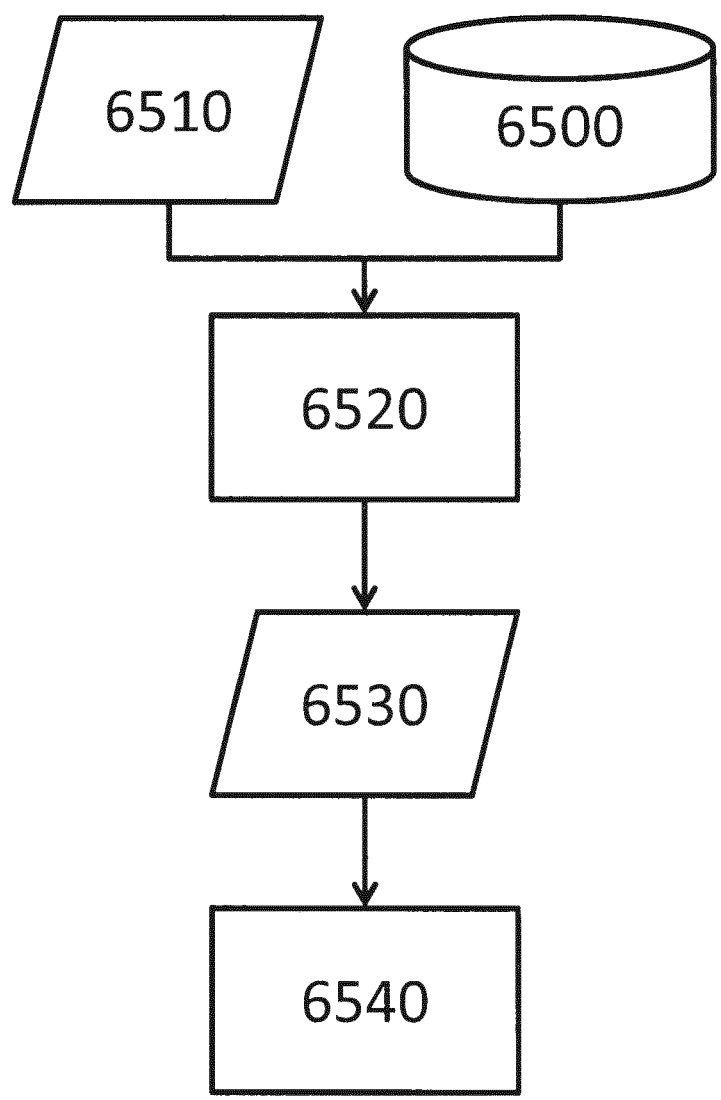
FIG. 6B schematically shows a flow chart for a method for avoiding including problematic color combinations in a design layout or a sub-layout.

FIG. 6B schematically shows a flow chart for a method for avoiding including problematic color combinations in a design layout or a sub-layout. In 6520, at least some patterns in a design layout or sub-layout 6510 and patterns stored in a database 6500 are matched. The database 6500 contains color combinations that should be avoided. Such color combinations may be obtained by any suitable methods. For example, the flows of FIG. 6A, FIG. 3B, FIG. 3C and FIG. 3D may be used for this purpose. If any match 6530 is found, the match 6530 may be adjusted (e.g., shape, location or other characteristics thereof may be changed) in 6540 so that the adjusted pattern no longer has a match in the database 6500.

Figure 6C:
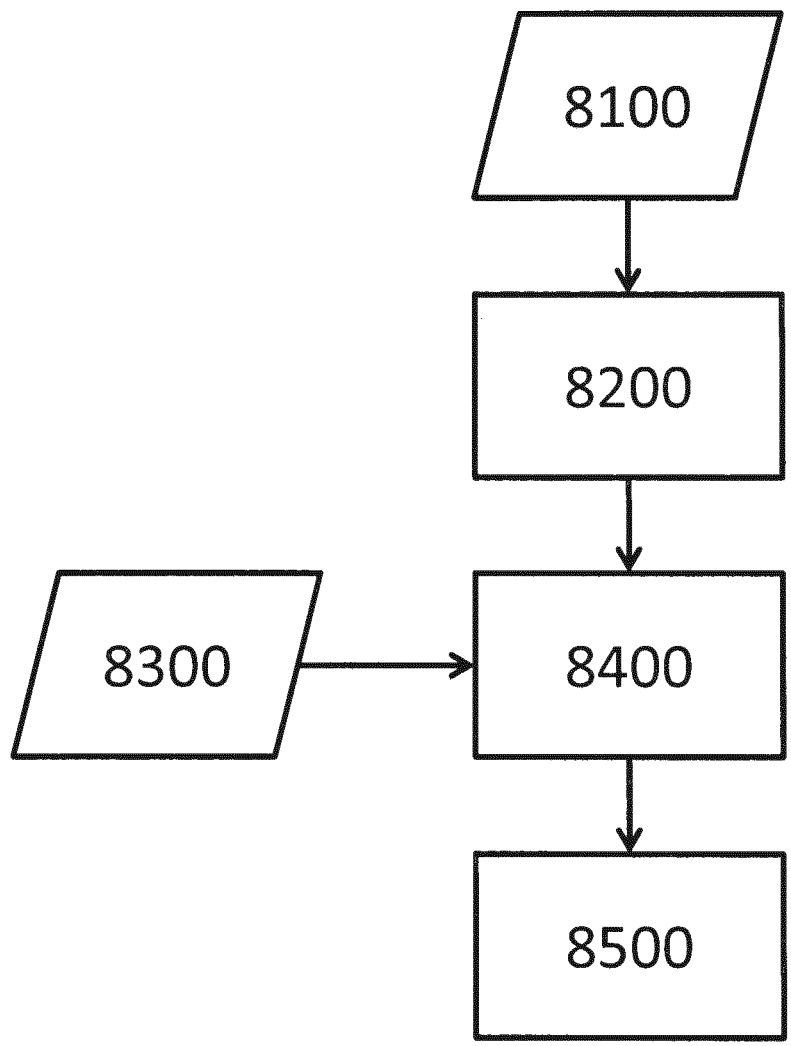
FIG. 6C schematically shows a flow chart for a method for selecting or presenting to a user the best color combination or the worst color combination for a group of patterns under a given condition of the lithography process.

FIG. 6C schematically shows a flow chart for a method for selecting or presenting to a user the best color combination or the worst color combination for a group of patterns under a given condition of the lithography process. In 8200, a group of color combinations (e.g., all possible color combinations) of the group of patterns 8100 are identified. In 8400, a characteristic of the lithography process under a condition 8300 using each of the group of combinations is determined (e.g., by simulation). For example, the condition 8300 may include a source, projection optics of a lithography apparatus, processing parameters such as dose or focus, etc. For example, the characteristic may include a characteristic (e.g., image log slope (ILS)) of an image produced in the lithography processes. In 8500, a best combination or a worst color combination may be selected from the group of color combinations based on the characteristic of the lithography process. The best or the worst color combination may be presented to a user.

Figure 7:
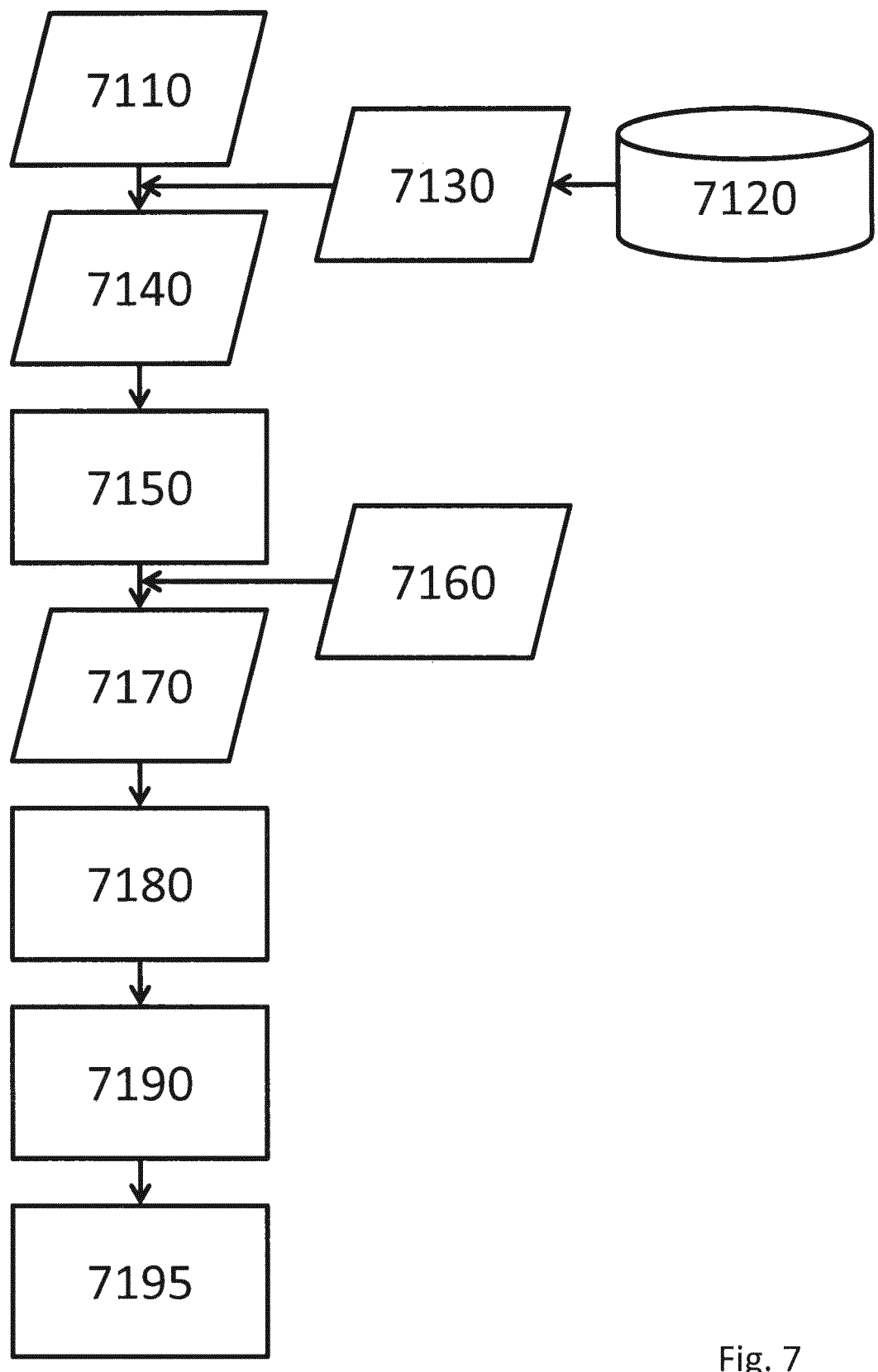
FIG. 7 schematically shows a flow chart for a method where repetitive patterns in a design layout can be colored similarly.

FIG. 7 schematically shows a flow chart for a method where repetitive patterns in a design layout 7110 can be colored similarly. A pattern to be matched 7130 is obtained from a database 7120. For example, the pattern to be matched 7130 may be a pattern that is empirically known to be critical. Patterns 7140 identical or similar to the pattern to be matched 7130 are identified from the design layout 7110. In 7150, the color of the pattern to be matched 7130 is determined (from the database 7120 or from simulation of the pattern to be matched 7130) and is applied to all the patterns 7140. Whether two patterns are identical or similar may be determined by a suitable method such as a fuzzy pattern matching technique or a machine learning technique. The term "two patterns being similar" means that the two patterns satisfy one or more rules that are suitable to measure resemblance or commonality of the two patterns. Additional patterns 7160 (without or with colors assigned thereto) of the design layout 7110 may be combined with patterns 7140 into a combination 7170. In 7180, the colors of the combination 7170 are adjusted or assigned to resolve any conflict among the combination 7170. For example, the adjustment in 7180 can be based on one or more rules. The adjustment in 7180 may avoid changing the colors of the patterns 7140 as determined in 7150. In 7190, the combination 7170 undergoes OPC. The combination 7170 then is subjected to manufacturability check (MC) in 7195. If the combination 7170 passes MC, the combination 7170 may be suitable for use in the lithography process.

In one or more embodiments, optimization can be performed using a cost function, such as $$CF(z_1,z_2,\ldots,z_N)=\sum_{p=1}^{P} w_p f_p^2(z_1,z_2,\ldots,z_N) \quad \text{(Eq. 1)}$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a design layout, or resist image, or aerial image.

The cost function may represent any suitable characteristics of the lithographic projection apparatus or the substrate, for instance, focus, CD, image shift, image distortion, image rotation, etc. For example, the cost function may be a function of one or more of the following lithographic metrics: edge placement error, critical dimension, resist contour distance, worst defect size, stochastic effect, three-dimensional effect of the patterning device, three-dimensional effect of the resist, best focus shift, pupil fill factor, exposure time, and throughput. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, and/or thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $CF(z_1, z_2, \ldots, z_N)=\sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1,z_2,\ldots,z_N)=\sum_{p=1}^{P} w_p f_p^2(z_1,z_2,\ldots,z_N)= \\ \sum_{u=1}^{U}\sum_{P_u=1}^{P_u} w_{P_u} f_{P_u}^2(z_1,z_2,\ldots,z_N) \quad \text{(Eq. 1')}$$

where $f_{P_u}(z_1, z_2, \ldots, z_N)$ is a function of the difference between an actual value and an intended value of the $p_u$-th evaluation point for a set of values of the design variables of $(z_1, z_2, \ldots, z_N)$ under the u-th PW condition u=1, \ldots, U. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the wafer EPE and the induced mask edge bias.

The design variables may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing patterning device manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1,\tilde{z}_2,\ldots,\tilde{z}_N)=\arg\min_{(z_1,z_2,\ldots,z_N)\in Z} \\ CF(z_1,z_2,\ldots,z_N)=\arg\min_{(z_1,z_2,\ldots,z_N)\in Z} \\ \sum_{p=1}^{P} w_p f_p^2(z_1,z_2,\ldots,z_N) \quad \text{(Eq. 2)}$$

In an embodiment, instead of, or in addition to, calculating and/or determining the effect on the optical characteristics of the projection optics, it is envisioned that adjustable optical characteristics of the projection optics can be included in the design variables. Exemplary adjustable optical characteristics may include as lens manipulators, the temperature data or signal associated with the temperature data of one or more devices, e.g. heaters, utilized to control the temperature of an optical element of the projection system, Zernike coefficients. The SMO procedure can then be carried out and the design variables, including the adjustable optical characteristics, can be simultaneously adjusted so that the cost function is moved towards convergence.

The optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the source, patterning device, projection optics and/or any other design variables, are allowed to change at the same time. Alternatively, the optimization of all the design variables is executed alternately. In this flow, in each step, some design variables are fixed while the other design variables are optimized to minimize the cost function; then in the next step, a different set of variables are fixed while the others are optimized to minimize the cost function. These steps are executed alternately until convergence or certain terminating conditions are met.

Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on.

The pattern selection algorithm, as discussed before, may be integrated with the simultaneous or alternate optimization. For example, when an alternate optimization is adopted, first a full-chip SO can be performed, the 'performance limiting spots' and/or 'warm spots' are identified, then an MO is performed. In view of the present disclosure numerous permutations and combinations of sub-optimizations are possible in order to achieve the desired optimization results.

In an exemplary optimization process, no relationship between the design variables ($z_1, z_2, \ldots, z_N$) and $f_p(z_1, z_2, \ldots, z_N)$ is assumed or approximated, except that $f_p(z_1, z_2, \ldots, z_N)$ is sufficiently smooth (e.g., first order derivatives $$\frac{\partial f_p(z_1, z_2, \ldots, z_N)}{\partial z_n},$$

(n=1, 2, ... N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find ($\tilde{z}_1, \tilde{z}_2, \ldots, \tilde{z}_N$).

Here, the Gauss-Newton algorithm is used as an example. The Gauss-Newton algorithm is an iterative method applicable to a general non-linear multi-variable optimization problem. In the i-th iteration wherein the design variables ($z_1, z_2, \ldots, z_N$) take values of ($z_{1i}, z_{2i}, \ldots, z_{Ni}$), the Gauss-Newton algorithm linearizes $f_p(z_1, z_2, \ldots, z_N)$ in the vicinity of ($z_{1i}, z_{2i}, \ldots, z_{Ni}$), and then calculates values ($z_{1(i+1)}, z_{2(i+1)}, \ldots, z_{N(i+1)}$) in the vicinity of ($z_{1i}, z_{2i}, \ldots, z_{Ni}$) that give a minimum of $CF(z_1, z_2, \ldots, z_N)$. The design variables ($z_1, z_2, \ldots, z_N$) take the values of ($z_{1(i+1)}, z_{2(i+1)}, \ldots, z_{N(i+1)}$) in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of ($z_{1i}, z_{2i}, \ldots, z_{Ni}$), $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \bigg( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni}) \bigg)^2 \quad \text{(Eq. 4)}$$

which is a quadratic function of the design variables ($z_1, z_2, \ldots, z_N$). Every term is constant except the design variables ($z_1, z_2, \ldots, z_N$).

If the design variables ($z_1, z_2, \ldots, z_N$) are not under any constraints, ($z_{1(i+1)}, z_{2(i+1)}, \ldots, z_{N(i+1)}$) can be derived by solving by N linear equations:

$$\frac{\partial CF(z_1, z_2, \ldots, z_N)}{\partial z_n} = 0,$$

wherein n=1, 2, ..., N.

If the design variables ($z_1, z_2, \ldots, z_N$) are under the constraints in the form of J inequalities (e.g. tuning ranges of ($z_1, z_2, \ldots, z_N$)) $\sum_{n=1}^{N} A_{nj} z_n \leq B_j$, for j=1, 2, ..., J.; and K equalities (e.g. interdependence between the design variables) $\sum_{n=1}^{N} C_{nk} z_n \leq D_k$, for k=1, 2, ..., K.;; the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between ($z_{1(i+1)}, z_{2(i+1)}, \ldots, z_{N(i+1)}$) and ($z_{1i}, z_{2i}, \ldots, z_{Ni}$), so that the approximation of Eq. 3 holds. Such constraints can be expressed as $z_{ni} - \Delta_D \leq z_n \leq z_{ni} + \Delta_D$. ($z_{1(i+1)}, z_{2(i+1)}, \ldots, z_{N(i+1)}$) can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \bigg( \frac{f_p(z_1, z_2, \ldots, z_N)}{CL_p} \bigg)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_n \leq \quad \text{(Eq. 6')}$$

$$E_{Up} + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_{ni} - f_p(z_{1i}, z_{2i}, \ldots, z_{Ni}) \text{ and}$$

$$-\sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_n \leq \quad \text{(Eq. 6'')}$$

$$-E_{Up} - \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} z_{ni} + f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda)\sum_{p=1}^{P} w_p f_p^2(z_1, z_2, \ldots, z_N) + \lambda \max_{1 \leq p \leq P} \frac{f_p(z_1, z_2, \ldots, z_N)}{CL_p} \quad \text{(Eq. 6''')}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f, \varepsilon)=(f_0 \pm \Delta f, \varepsilon_0 \pm \varepsilon)} \max_p |f_p(z_1, z_2, \ldots, z_N, f, \varepsilon)| \quad \text{(Eq. 27).}$$

or $$CF(z_1, z_2, \ldots, z_N, f_0, \varepsilon_0) = \sum_{(f, \varepsilon)=(f_0 \pm \Delta f, \varepsilon_0 \pm \varepsilon)} \sum_p w_p f_p^2(z_1, z_2, \ldots, z_N, f, \varepsilon) \quad \text{(Eq. 27')}$$

or $$CF(z_1, z_2, \ldots, z_N, f_0, \varepsilon_0) = (1-\lambda)\sum_{(f, \varepsilon)=(f_0 \pm \Delta f, \varepsilon_0 \pm \varepsilon)} \sum_p w_p f_p^2(z_1, z_2, \ldots, z_N, f, \varepsilon) + \lambda \max_{(f, \varepsilon)=(f_0 \pm \Delta f, \varepsilon_0 \pm \varepsilon)} \max_p |f_p(z_1, z_2, \ldots, z_N, f, \varepsilon)| \quad \text{(Eq. 27'')}$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

Figure 9:
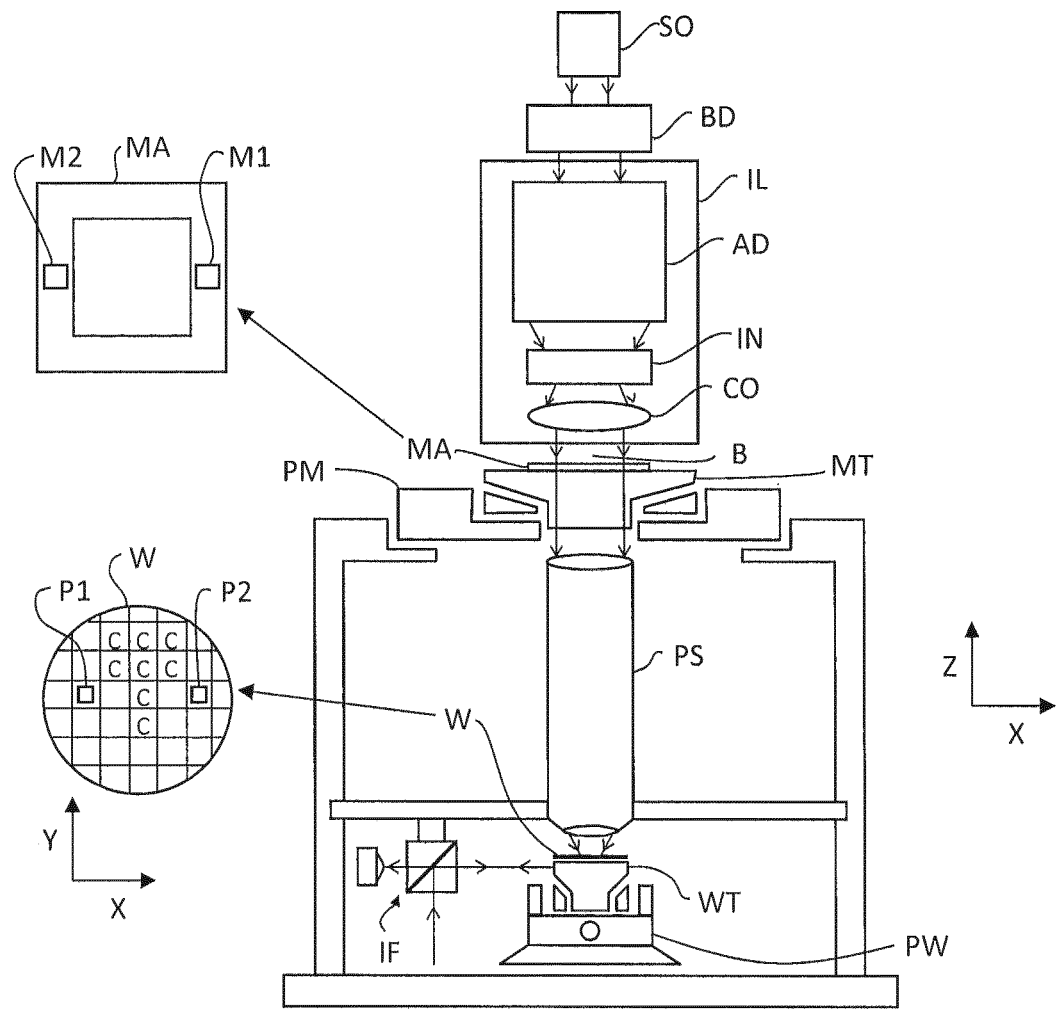
FIG. 9 is a schematic diagram of a lithographic projection apparatus.

The methods described earlier in this disclosure can be used to minimize the respective cost functions of Eqs. 27, 27', or 27". If the design variables are characteristics of the projection optics, such as the Zernike coefficients, then minimizing the cost functions of Eqs. 27, 27', or 27" leads to process window maximization based on projection optics optimization, i.e., LO. If the design variables are characteristics of the source and patterning device in addition to those of the projection optics, then minimizing the cost function of Eqs. 27, 27', or 27" leads to process window maximizing based on SMLO, as illustrated in FIG. 9. If the design variables are characteristics of the source and patterning device and, then minimizing the cost functions of Eqs. 27, 27', or 27" leads to process window maximization based on SMO.

Figure 8:
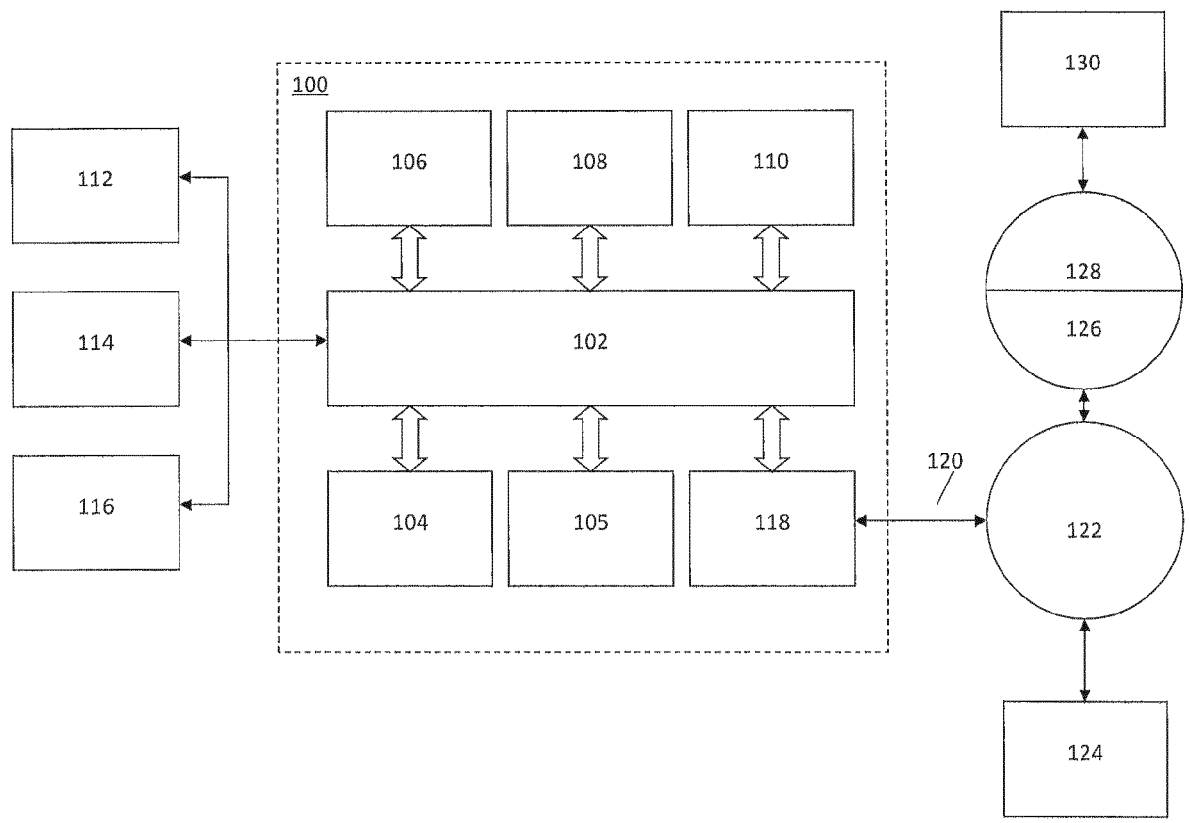
FIG. 8 is a block diagram of an example computer system in which embodiments can be implemented.

FIG. 8 is a block diagram that illustrates a computer system 100 that can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

FIG. 9 schematically depicts an exemplary lithographic projection apparatus whose illumination source could be optimized utilizing the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 10:
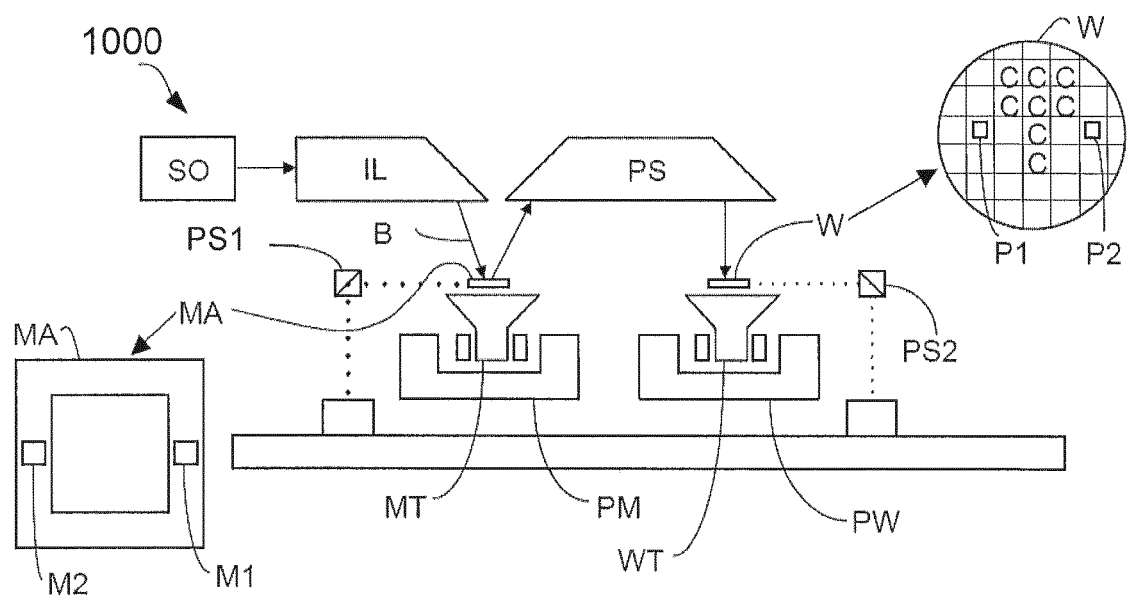
FIG. 10 is a schematic diagram of another lithographic projection apparatus.

FIG. 10 schematically depicts another exemplary lithographic projection apparatus 1000 whose illumination source could be optimized utilizing the methods described herein.

The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 10, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 10, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
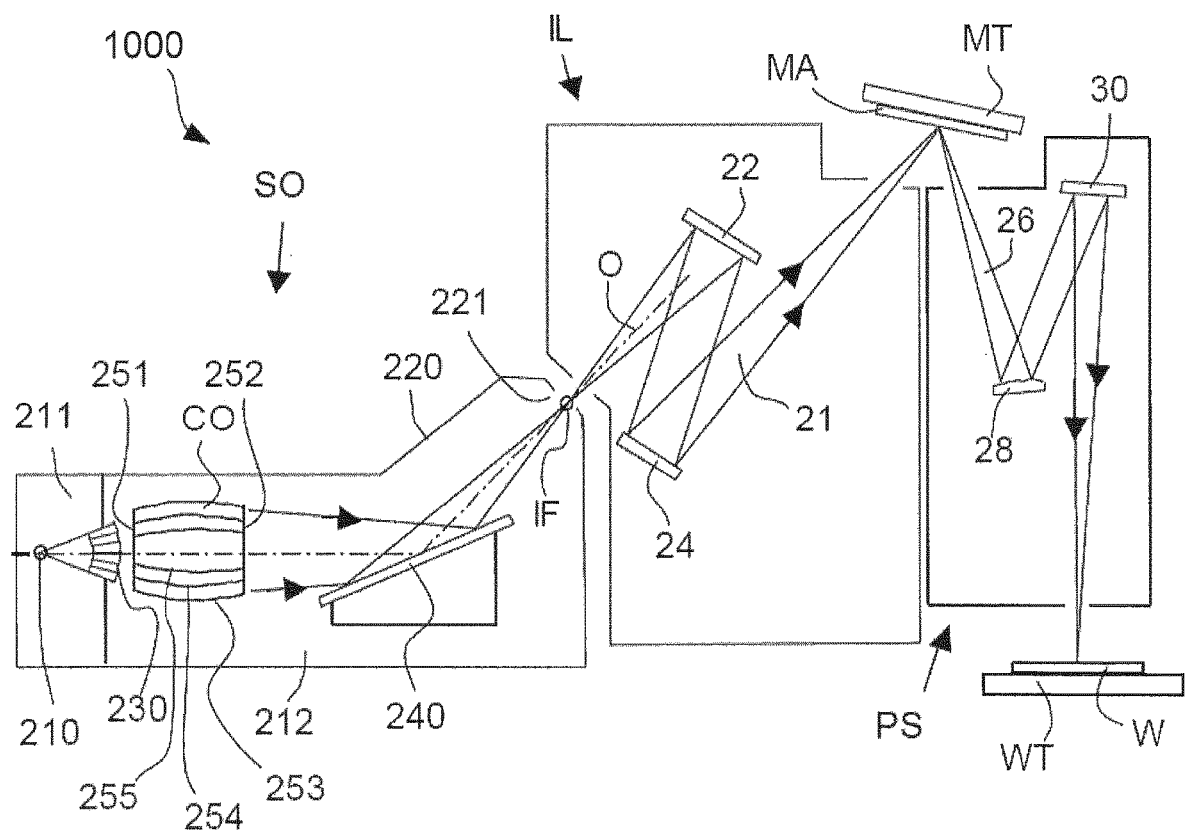
FIG. 11 is a more detailed view of the apparatus in FIG. 10.

FIG. 11 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 12:
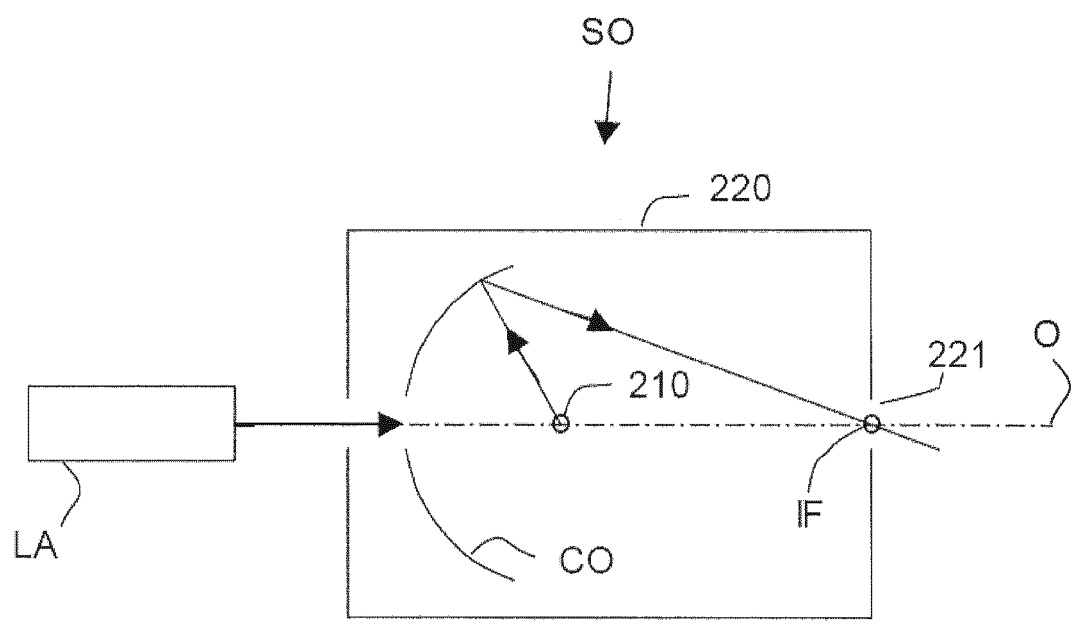
FIG. 12 is a more detailed view of the source collector module SO of the apparatus of FIG. 10 and FIG. 11.

Alternatively, the source collector module SO may be part of an LPP radiation system as shown in FIG. 12. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The invention may further be described using the following clauses:

1. A computer-implemented method comprising:
    obtaining a sub-layout comprising an area that is a performance limiting spot;
    adjusting colors of patterns in the area; and
    determining whether the area is still performance limiting spot.
2. The method of clause 1, further comprising subjecting the patterns to optical proximity correction (OPC).
3. The method of any one of clauses 1 to 2, further comprising: if the area is still performance limiting spot, readjusting the colors of the patterns.
4. The method of any one of clauses 1 to 3, wherein adjusting the colors comprises:
    searching for color combinations of the patterns, wherein the color combinations make the performance limiting spot no longer a performance limiting spot;
    if no color combination is found, the patterns are combined with at least some patterns outside the performance limiting spot of the sub-layout.
5. The method of clause 4, wherein searching for color combinations of the patterns comprises:
    obtaining a set of color combinations of the patterns, wherein the color combinations do not violate any design rules for the sub-layer;
    for each of color combinations in the set, determining one or more characteristics of a lithography process using that color combination;
    selecting one color combination from the set based on the characteristics.
6. The method of clause 4, wherein searching for color combinations of the patterns comprises:
    identifying a pair of patterns among the patterns in the performance limiting spot; assigning different colors to the pair of patterns.
7. The method of any one of clauses 4 to 6, wherein the one or more characteristics comprise one or more characteristics of an image produced using the that color combination.
8. A computer-implemented method comprising:
    decomposing patterns in a design layout into multiple sub-layouts;
    determining for at least one area in one of the sub-layouts, the likelihood of that a figure of merit is beyond its allowed range;
    if the likelihood is above a threshold, that one sub-layout has a performance limiting spot.
9. The method of clause 8, further comprising subjecting patterns on each of the sub-layouts to optical proximity correction (OPC).
10. A computer-implemented method comprising:
    obtaining a design layout comprising a first group of patterns and an optional second group of patterns, wherein colors of the second group of patterns are not allowed to change and colors of the first group of patterns are allowed to change;
    identifying all color combinations of the first group of patterns, wherein the color combinations do not violate any design rules;
    optionally selecting representatives of the first group of patterns and color combinations thereof, and the optional second group of patterns;
    co-optimizing the design layout and a source of a lithographic apparatus for the representatives or the design layout for the first group of patterns and the optional second group of patterns;
    if not all of the first group of patterns and the optional second group of patterns with all the color combinations satisfy one or more criteria, adjusting selection of the representatives to include more patterns thereto, or adjusting co-optimization.
11. The method of clause 10, wherein co-optimizing at least the first group of patterns, the second group of patterns and the source comprises:
    computing a multi-variable cost function of a plurality of design variables comprise characteristics of at least the first group of patterns, the second group of patterns and the source; and
    iteratively reconfiguring at least the first group of patterns, the second group of patterns and the source by adjusting the design variables until a predefined termination condition is satisfied.
12. The method of clause 11, wherein the design variables comprise characteristics of projection optics of the lithographic apparatus.
13. The method of any of clauses 10 to 11, wherein the predefined termination condition is one minimization of the cost function or maximization of the cost function.
14. The method of any of clauses 10 to 13, wherein iterative reconfiguration is performed with constraints on at least some of the design variables.
15. A computer-implemented method comprising:
    obtaining a pattern to be matched from a database;
    obtaining a color for the pattern to be matched based on a metric of simulation of the pattern to be matched;
    identifying patterns identical or similar to the pattern to be matched from a design layout;
    assigning the color to the identified patterns;
    combining a second pattern with the identified patterns into a combination;
    adjusting or assigning colors to patterns in the combination to resolve any conflict among the combination.
16. The method of clause 15, further comprising subjecting the combination to OPC.
17. The method of clause 15, further comprising subjecting the combination to manufacturability check.
18. The method of any one of clauses 15 to 17, wherein the color assigned to the first pattern does not change in adjusting or assigning the colors to the patterns in the combination.
19. A computer-implemented method comprising:
    obtaining a pattern to be matched from a database;
    obtaining a color for the pattern to be matched from the database;

identifying patterns identical or similar to the pattern to be matched from a design layout;
assigning the color to the identified patterns;
combining a second pattern with the identified patterns into a combination;
adjusting or assigning colors to patterns in the combination to resolve any conflict among the combination.
20. The method of clause 19, further comprising subjecting the combination to OPC.
21. The method of any one of clauses 19 to 20, further comprising subjecting the combination to manufacturability check.
22. A computer-implemented method comprising:
identifying a group of color combinations of a group of patterns;
determining a characteristic of a lithography process under a condition using each of the group of combinations is determined;
selecting a sub-group of color combinations from the group of color combinations based on the characteristic of the lithography process.
23. The method of clause 22, wherein the group of color combinations comprises all possible color combinations of the group of patterns.
24. The method of any one of clauses 22 to 23, wherein the condition comprises one or more parameters of a lithography apparatus used the lithography process.
25. The method of any one of clauses 22 to 23, wherein the condition comprises one or more parameters of the lithography process.
26. A computer-implemented method comprising:
searching for a match to a pattern in a design layout or sub-layout among patterns stored in a database;
if a match is found, adjusting a characteristic of the pattern so that the adjusted pattern does not have a match in the database.
27. The method of clause 26, wherein the characteristic is shape or location of the pattern.
28. A computer program product comprising a computer readable medium having instructions recorded thereon, the instructions when executed by a computer implementing the method of any of the above clauses.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
obtaining a colored design layout comprising a sub-layout comprising an area that is a performance limiting spot;
searching for a color combination of patterns in the area to make the area no longer a performance limiting spot;
responsive to no color combination being found from the searching that makes the area no longer a performance limiting spot, combining patterns in the area with at least one pattern outside the area to yield an aggregation of patterns;
adjusting, by a hardware computer system, a color of at least one pattern of the aggregation of patterns; and
subsequent to the adjusting, determining, by the hardware computer system, whether the area is still a performance limiting spot.
2. The method of claim 1, further comprising, responsive to a determination that the area is still a performance limiting spot; adding at least one further pattern outside the area to the aggregation of patterns.
3. The method of claim 1, wherein the searching for a color combination of patterns comprises:
obtaining a set of color combinations of patterns, wherein the set of color combinations do not violate any design rules for a sub-layer;
for a respective color combination in the set, determining one or more characteristics of a lithography process using the respective color combination; and
selecting a color combination from the set based on the one or more characteristics.
4. The method of claim 1, wherein the searching for a color combination of patterns comprises:
identifying a pair of patterns among patterns in the performance limiting spot; and
assigning different colors to the pair of patterns.
5. The method of claim 1, wherein the design layout comprises a first group of patterns and a second group of patterns, wherein colors of the second group of patterns are not allowed to change and colors of the first group of patterns are allowed to change.
6. A computer program product comprising a non-transitory computer readable medium having instructions therein, the instructions, upon execution by a computer system, configured to cause the computer system to at least:
obtain a colored design layout comprising a sub-layout comprising an area that is a performance limiting spot;
search for a color combination of patterns in the area to make the area no longer a performance limiting spot;
responsive to no color combination being found from the searching that makes the area no longer a performance limiting spot, combine patterns in the area with at least one pattern outside the area to yield an aggregation of patterns;
adjusting a color of at least one pattern of the aggregation of patterns; and
subsequent to the adjustment, determine whether the area is still a performance limiting spot.
7. The computer program product of claim 6, wherein the instructions are further configured to cause the computer system to, responsive to a determination that the area is still a performance limiting spot, add at least one further pattern outside the area to the aggregation of patterns.
8. The computer program product of claim 6, wherein the instructions configured to cause the computer system to search for a color combination of patterns are further configured to cause the computer system to:

obtain a set of color combinations of patterns, wherein the set of color combinations do not violate any design rules for a sub-layer;
for a respective color combination in the set, determining one or more characteristics of a lithography process using the respective color combination; and
selecting a color combination from the set based on the one or more characteristics.

9. The computer program product of claim 6, wherein the instructions configured to cause the computer system to search for a color combination of patterns are further configured to cause the computer system to:
identify a pair of patterns among patterns in the performance limiting spot; and
assign different colors to the pair of patterns.

10. The computer program product of claim 6, wherein the design layout comprises a first group of patterns and a second group of patterns, wherein colors of the second group of patterns are not allowed to change and colors of the first group of patterns are allowed to change.

11. A method comprising:
obtaining a colored design layout comprising a sub-layout comprising an area that is a performance limiting spot;
adjusting, by a hardware computer system, a color of at least one pattern in the area, wherein the design layout comprises a first group of patterns and a second group of patterns, wherein colors of the second group of patterns are not allowed to change and colors of the first group of patterns are allowed to change; and
subsequent to the adjusting, determining, by the hardware computer system, whether the area is still a performance limiting spot.

12. The method of claim 11, further comprising, responsive to a determination that the area is still a performance limiting spot, combining a pattern outside the performance limiting spot of the sub-layout with patterns in the area for evaluation in the adjusting step.

13. The method of claim 11, further comprising:
searching for a color combination of patterns in the area, that makes the performance limiting spot no longer a performance limiting spot; and
responsive to no color combination being found that makes the performance limiting spot no longer a performance limiting spot, including at least one pattern outside the performance limiting spot of the sub-layout for evaluation in the adjusting step.

14. The method of claim 13, wherein the searching for a color combination of patterns comprises:
obtaining a set of color combinations of patterns, wherein the set of color combinations do not violate any design rules for a sub-layer;
for a respective color combination in the set, determining one or more characteristics of a lithography process using the respective color combination; and
selecting a color combination from the set based on the one or more characteristics.

15. The method of claim 13, wherein the searching for a color combination of patterns comprises:
identifying a pair of patterns among patterns in the performance limiting spot; and
assigning different colors to the pair of patterns.

16. A computer program product comprising a non-transitory computer readable medium having instructions therein, the instructions, upon execution by a computer system, configured to cause the computer system to at least:
obtain a colored design layout comprising a sub-layout comprising an area that is a performance limiting spot;
adjust a color of at least one pattern in the area, wherein the design layout comprises a first group of patterns and a second group of patterns, wherein colors of the second group of patterns are not allowed to change and colors of the first group of patterns are allowed to change; and
subsequent to the adjustment, determine whether the area is still a performance limiting spot.

17. The computer program product of claim 16, wherein the instructions are further configured to cause the computer system to, responsive to a determination that the area is still a performance limiting spot, evaluate a patterrioutside the performance limiting spot of the sub-layout as part of the adjustment.

18. The computer program product of claim 16, wherein the instructions are further configured to cause the computer system to:
search for a color combination of patterns in the area, that makes the performance limiting spot no longer a performance limiting spot; and
responsive to no color combination being found that makes the performance limiting spot no longer a performance limiting spot, include at least one pattern outside the performance limiting spot of the sub-layout for evaluation in the adjustment.

19. The computer program product of claim 18, wherein the instructions configured to cause the computer system to search for a color combination of patterns are further configured to cause the computer system to:
obtain a set of color combinations of patterns, wherein the set of color combinations do not violate any design rules for a sub-layer;
for a respective color combination in the set, determine one or more characteristics of a lithography process using the respective color combination; and
select a color combination from the set based on the one or more characteristics.

20. The computer program product of claim 18, wherein the instructions configured to cause the computer system to search for a color combination of patterns are further configured to cause the computer system to:
identify a pair of patterns among patterns in the performance limiting spot; and
assign different colors to the pair of patterns.

* * * * *